(12) United States Patent
Nemati et al.

(10) Patent No.: US 7,037,763 B1
(45) Date of Patent: May 2, 2006

(54) GATED-THYRISTOR APPROACH HAVING ANGLE-IMPLANTED BASE REGION

(75) Inventors: Farid Nemati, Menlo Park, CA (US); Scott Robins, San Jose, CA (US); Andrew E. Horch, Sunnyvale, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 42 days.

(21) Appl. No.: 10/739,859

(22) Filed: Dec. 18, 2003

Related U.S. Application Data

(60) Provisional application No. 60/437,547, filed on Dec. 31, 2002.

(51) Int. Cl.
*H01L 21/332* (2006.01)

(52) U.S. Cl. ...................................... 438/133
(58) Field of Classification Search ................ 438/133
See application file for complete search history.

(56) References Cited

U.S. PATENT DOCUMENTS 6,767,770 B1 * 7/2004 Horch et al. ................ 438/133
6,828,176 B1 * 12/2004 Nemati et al. .............. 438/133
6,828,202 B1 * 12/2004 Horch ........................ 438/302

* cited by examiner

*Primary Examiner*—Thao P. Le

(57) ABSTRACT

In an example gated-thyristor circuit, formation of thyristor body regions involves an angled implant of a thyristor body region, such as a base region, to mitigate capacitive coupling of a gated voltage pulse from the thyristor gate to a body region that is not underlying the thyristor gate. According to a more particular example embodiment, such a thyristor switches between a current-passing mode and a current blocking mode in response to at least one voltage pulse coupling to an underlying thyristor base region. Using a first ion type to provide one polarity, an immediately-adjacent thyristor base region is angle implanted through an emitter body region that is located to other side of the adjacent thyristor base region. The emitter body region is then implanted using ions of another ion type to provide the opposite polarity. This angle implantation permits definition of the adjacent thyristor base region sufficiently distant from (e.g., underlapping) the gate to mitigate gate-induced leakage to the second body region and the associated junction leakage between thyristor base regions. Applications include a variety of circuits benefiting from fast-switching and/or small-architecture features; example applications include thyristor-based latches and memory cells and power thyristor circuits.

12 Claims, 5 Drawing Sheets

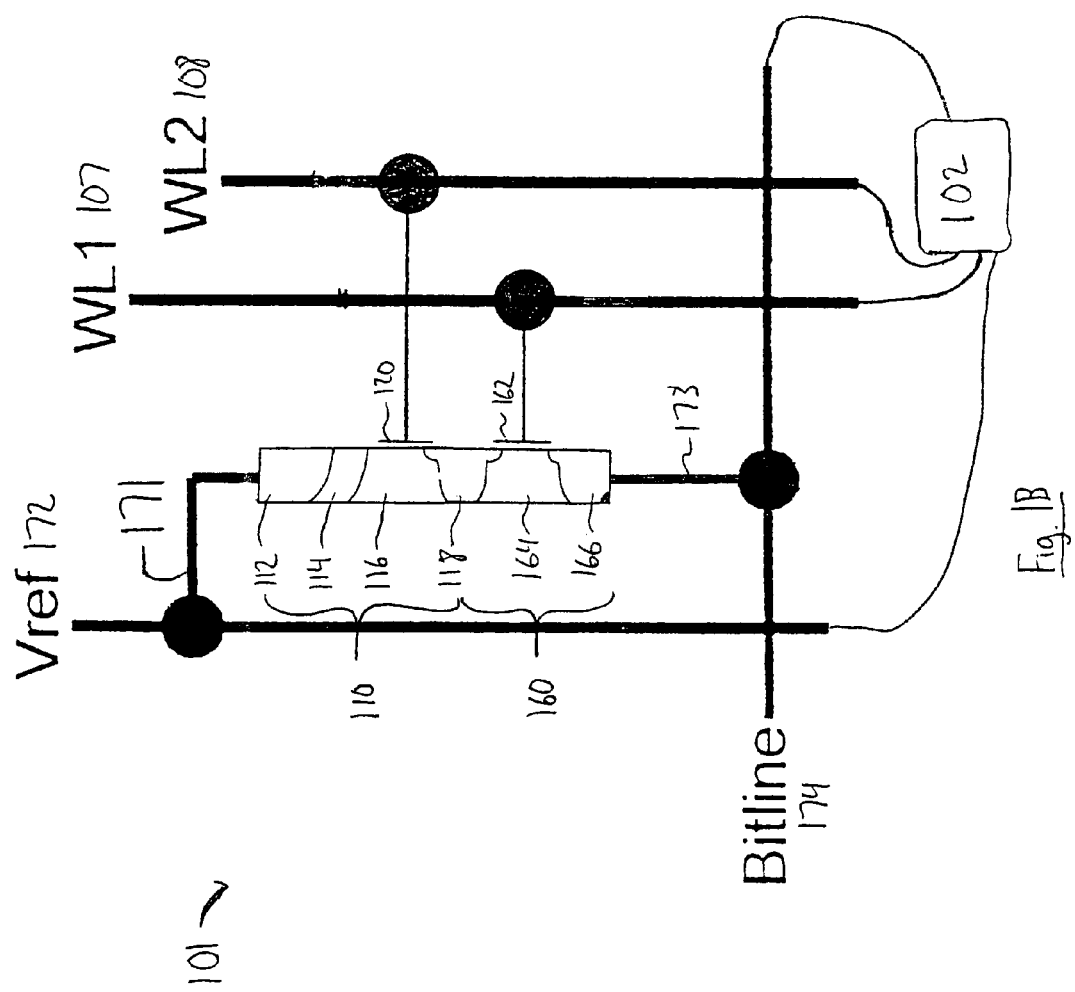

GATED-THYRISTOR APPROACH HAVING ANGLE-IMPLANTED BASE REGION

RELATED PATENT DOCUMENTS

This application claims the benefit of U.S. Provisional Patent Application Ser. No. 60/437,547, entitled "Gated-Thyristor Approach Having Angle-Implanted Base Region," filed Dec. 31, 2002. This provisional patent application is incorporated herein by reference.

FIELD OF THE INVENTION

The present invention is directed to circuits using thyristors and, more specifically, to semiconductor-based circuits benefiting from fast-switching, gate-controlled thyristors.

BACKGROUND

Recent technological advances in the semiconductor industry have permitted dramatic increases in integrated circuit density and complexity, and equally dramatic decreases in power consumption and package sizes. As the use of these devices has become more prevalent, the demand for reliable and affordable semiconductor devices has also increased. Accordingly, the need to manufacture such devices in an efficient and reliable manner has become increasingly important. In addition, the alignment and arrangement of circuit features has become increasingly important as the size of such devices is mitigated.

A variety of approaches to the arrangement and manufacture of semiconductor devices involve the organization and alignment of a variety of circuit elements. One type of application wherein the alignment of adjacent circuits is important is semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 120 $F^2$.

Various SRAM cell designs based on a NDR (Negative Differential Resistance) construction have been introduced, ranging from a simple bipolar transistor (e.g., a metal-oxide field-effect transistor (MOSFET)) to complicated quantum-effect devices. Conventional NDR-based SRAM cells, however, have problems that have prohibited their use in commercial SRAM products. These problems include, for example: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin-capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the thyristor gate and the thyristor base region can substantially modulate the potential of the base region. Another important consideration in semiconductor device design, including those employing thin capacitively-coupled thyristor-type devices, includes forming devices with aligned regions, and effecting the alignment using a method of manufacturing that is efficient and reliable.

In a variety of semiconductor devices, such as thin capacitively-coupled thyristor devices, junction leakage can also be a problem. In thin-capacitively-coupled thyristor-type NDR devices, junction leakage can occur when the thyristor gate capacitively couples a voltage pulse to a thyristor base region that is adjacent the base region directly underlying the thyristor gate. This junction leakage can adversely affect the performance, for example, the switching speed or stability of the thyristor-based circuit.

These and other design considerations have presented challenges to efforts to implement devices in a variety of applications, and in particular to devices in highly dense applications.

SUMMARY

The present invention is directed to semiconductor devices, arrangements and approaches thereto that address the above-mentioned, and other, challenges and applications. The present invention is exemplified in a number of implementations and applications, some of which are summarized below.

According to one aspect, an example embodiment of the present invention is directed to a method for manufacturing a semiconductor device having a thyristor that is adapted to switch between two stable conductance states. The thyristor switches states in response to at least one voltage pulse presented at a capacitively-coupled thyristor gate. The example method includes forming a thyristor body with a plurality of body regions. These body regions include a second body region which is located between first and third body regions and which is angle-ion-implanted through the first body region. The thyristor gate is formed so that it overlaps the third body region and underlaps the second body region.

According to another example embodiment of the present invention, a gated thyristor circuit is formed with a plurality of thyristor body regions, at least one of which involves an angled implant approach implemented to mitigate capacitive coupling of a gated voltage pulse from the thyristor gate to a body region that is not underlying the thyristor gate. In a more particular example embodiment, the angle-implanted body region is a base region adjacent to another base region that underlies the thyristor gate.

According to another particular example embodiment, such a thyristor as discussed in the preceding paragraph switches between a current-passing mode and a current blocking mode in response to at least one voltage pulse coupled from a gate to an underlying thyristor base region. Using a first ion type to provide one polarity, an adjacent thyristor base region is angle implanted through an emitter body region that is located to the other side of the adjacent thyristor base region. The emitter body region is then implanted using ions of another ion type to provide the opposite polarity. This angle implantation approach permits definition of the adjacent thyristor base region sufficiently distant from the gate to reduce (i.e., mitigate) or avoid capacitive coupling of the voltage pulse from the thyristor gate and the associated junction leakage.

In a more particular example embodiment of the present invention, the above-characterized gated-thyristor design is used in each of a plurality of memory cells formed in an array. The array employs a bit line and first and second word lines. The second word line carries at least one voltage pulse that is used to facilitate switching of the thyristor between a current-blocking mode and a current-passing mode. Each cell in the array includes a thyristor body, a thyristor gate and a current switch, e.g., a MOSFET circuit (an example type of insulated-gate field-effect transistor (IGFET)).

The thyristor body has at least first, second and third body regions, with the second body region located between the first and third body regions and angle-ion-implanted through the first body region with a first ion type to provide one polarity. The first body region also includes ions of the first type but is dominated by ions of another ion type to provide the opposite polarity. The thyristor gate is located adjacent the third body region and is adapted to capacitively couple the voltage pulse from the thyristor gate to the third body region. The thyristor gate is further sufficiently insulated from the second body region to mitigate capacitive coupling of the voltage pulse from the thyristor gate to the second body region. The current switch responds to signals from the first word line and has a port adapted for passing thyristor current from the thyristor body to the bit line.

Other aspects and embodiments of the present invention are directed to methods of manufacturing related to gated-thyristor designs and to applications and implementations of the above-characterized gated-thyristor design including but not necessarily limited to power thyristor circuits and thyristor-based data latches. For example, in connection with one particular method of manufacturing such a gated-thyristor design, the present invention permits the angle-implanted thyristor base region to be formed independent of photolithography variations.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 1B is a circuit including the thyristor device shown in FIG. 1A, according to another example embodiment of the present invention;

Figure 1A:
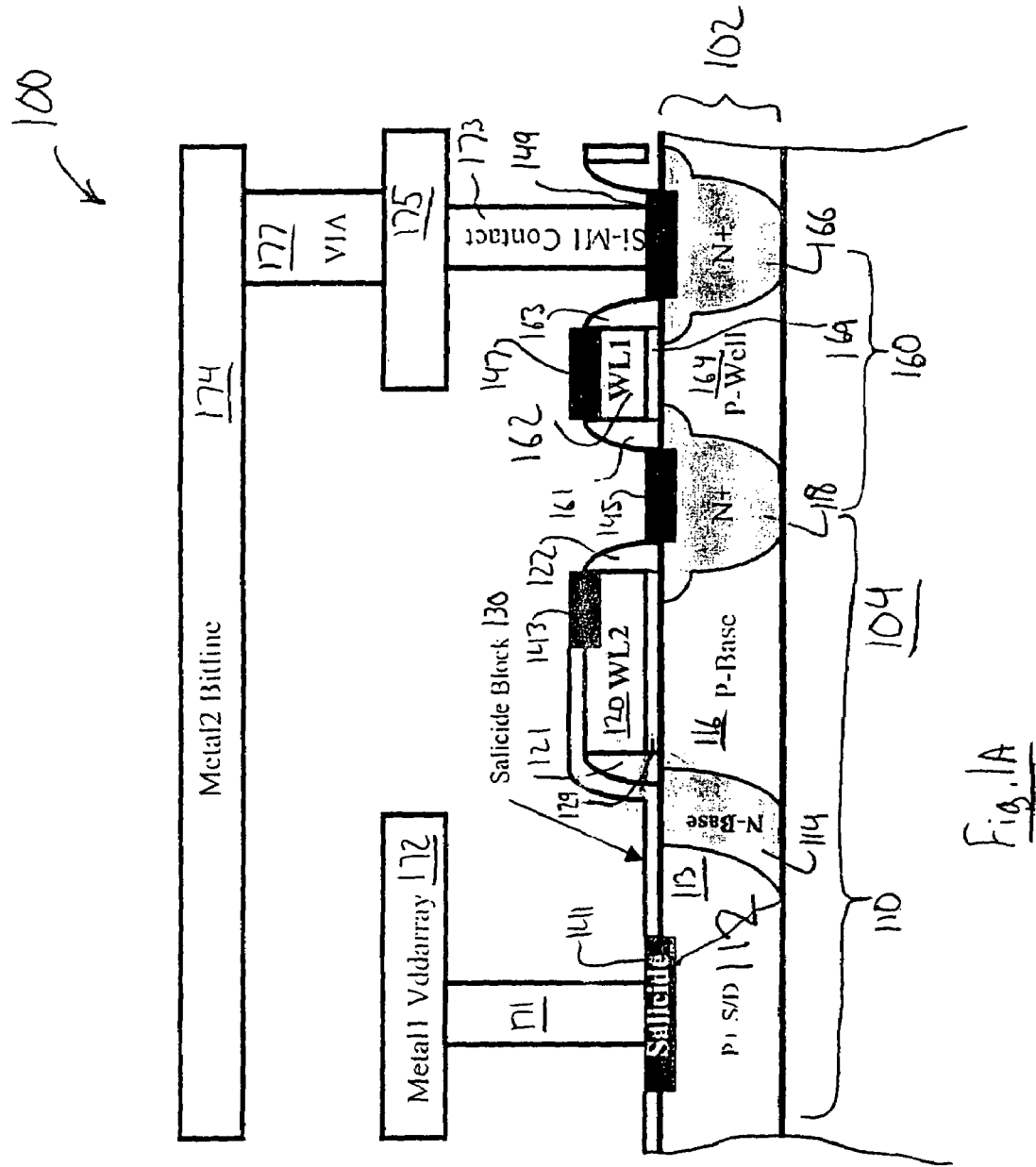
FIG. 1A is a cross-sectional view of a thyristor device at a particular stage of manufacture, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor applications, such as memory devices and current-switching circuitry. While the present invention is not necessarily limited to such applications, various aspects of the invention may be appreciated through a discussion of various examples using this context.

According to an example embodiment of the present invention, a thyristor includes first and second adjacent body regions sharing a p-n junction therebetween, with the first body region being dominated by ions of a first type and the second body region being dominated by ions of a second type. A portion of the first body region (e.g., a portion via which the second body region is implanted) also includes ions of the second type. The first type of ions provide a first polarity in the first body region, and the ions of the second type provide a second polarity in the second body region that is opposite the polarity of the first body region. In one implementation, the second body region is a base region having a relatively low ion concentration and the first body region is an emitter region opposite in polarity to and having a relatively higher ion concentration than the base region. In another particular implementation, the ion concentration of the first type of ions in the first body region is on an order of at least about 4 times greater than the ion concentration of the second type of ions in both the first and second body regions. In still other implementations, the relative concentration of ions in each of the body regions varies in different portions thereof (e.g., with a relatively higher concentration at a portion of the body via which the ions are implanted).

According to a more particular example embodiment of the present invention, the thyristor includes a third body region that is adjacent to the second body region, with the second body region being between the first and third body regions. A thyristor gate is over the third body region and adapted for capacitively coupling voltage pulses to the third body region via a dielectric. The second body region is implanted via the first body region using an approach involving a photoresist and an angled implant, with the implant angle selected to recess a doped portion of the second body region below the photoresist and laterally separated from the thyristor gate.

In one implementation, using one or more of the approaches discussed herein, leakage at a junction between an angle-implanted base region and an adjacent base region is controlled using the angled implant to distance the junction from the gate. For instance, in gated thyristor applications, the junction leakage can be set (e.g., mitigated and/or eliminated) such that switching of the gated thyristor between conductance states is not significantly slowed as a result of the junction leakage.

In another implementation, using one or more of the approaches discussed herein, capacitive coupling between an angle-implanted base region and an adjacent gate is controlled using the angled implant to distance the base region from the gate. In gated thyristor applications having immediately adjacent base regions, it is sometimes desirable to directly capacitively couple to only one of the base regions. In this regard, the angled implant is used to distance one of the base regions from the gate, such that capacitive coupling from the gate is primarily to only one of the base regions (e.g., with only residual capacitive coupling, if any, to the angle-implanted base region). In one instance, the angle of the implant is selected such that capacitive coupling of voltage pulses from the gate does not forward bias a junction between the first and second body regions.

In still another implementation, an angled-implant approach is used to compensate for photolithography variation that can occur, for example, due to mask misalignment when exposing a photoresist through the mask. By detecting the variation, for example, by measuring an offset distance of a portion of the photoresist on a sample wafer, the variation can be used to set the angle of the implant to achieve a desired offset from an adjacent feature. With this approach, variation in photolithography that can result in undesirable location of features (e.g., the offset distance between a thyristor body region and a thyristor gate) can be overcome.

In certain embodiments, it is desirable to provide similarly-constructed thyristors but oriented relative one another over an insulative layer of an SOI-based device. While similarly-constructed, the relative orientations of the thyristors result in undesired photolithography-caused variations in the respective widths of the thyristor base regions. These variations are sometimes due to conventional-processing issues such as the positioning of the wafer relative to the photolithography equipment.

Implementations of the present invention can be used to lessen these variations significantly; in various applications, the respective widths of the angle-implanted thyristor base regions (e.g., the N-base region) can be held to within to ten percent. In some implementations of the present invention, improving control over the angle implant process can reduce this variable to within five percent and, in other implementations, to within even one percent.

In a more particular implementation, one or more of a variety of other implant characteristics, in addition to the angle as discussed above, are adjusted to achieve a desired offset of an angle-implanted body region from a device feature. The offset condition (and/or the profile of the angle-implanted region) can be set, for instance, by selecting one or more of: the power of an ion implant, the amount/quantity of ions implanted, the annealing processes or the type of material implanted. Various ones of these and other characteristics can be selected, for example, using empirical testing for specific implementations. For general information regarding ion implantation and for specific information regarding an approach for selecting ion implant characteristics that may be implemented in connection with one or more of the example embodiments discussed herein, reference may be made to Wolf et al., "Silicon Processing for the VLSI Era," Volume 1, pages 280–330, which is fully incorporated herein by reference.

FIG. 1A shows a semiconductor device 100 including a thyristor 110 having an emitter region 112 being dominated by a first dopant and an adjacent base region 114 having a second dopant that is different than the first dopant, according to another example embodiment of the present invention. An upper portion 113 of the emitter region 112 has both the first and second dopants, with the first dopant dominating the polarity of the upper portion (as well as the rest of the emitter region 112). The thyristor 110 is coupled in series with a MOSFET 160, with both formed in a thin silicon layer 102 that is over an insulator layer 104 in a silicon-on-insulator (SOI) arrangement.

The thyristor 110 further includes a P-base region 116 and an N+ emitter region 118 in addition to the (P+) emitter region 112 and (N) base region 114, with a thyristor gate 120 capacitively coupled via a dielectric 129 to the P-base region 116. The N-base region 114 curves laterally away from under the thyristor gate 120, as do interfaces (i.e., junction regions) between the P+ emitter 112, N-base and P-base 116. Sidewall spacers 121 and 122 are on opposite sides of the thyristor gate 120. A salicide block 130 is shown extending over a portion of the thyristor 110 for preventing the formation of salicide during salicidation. Using the salicide block 130, salicide regions 141 and 143 are formed and facilitate contact to the P+ emitter region 112 and the thyristor gate 120, respectively.

The MOSFET 160 shares the N+ emitter region 118 (e.g., as a source/drain region) with the thyristor 110, and further includes N+ source/drain region 166, separated from the N+ emitter region by a p-well (i.e., channel) region 164. A gate electrode 162 is capacitively coupled via a dielectric 169 to the p-well region 164 for controlling current flow between the N+ source/drain region 166 and the N+ emitter region 118. Sidewall spacers 161 and 163 are on opposing sides of the gate electrode 162, and each of the N+ emitter region 118, source/drain region 166 and gate electrode 162 is salicided with regions 145, 147 and 149, respectively.

The device 100 is coupled to other circuitry via contacts 171 and 173, which are respectively coupled to salicide region 141 of the P+ emitter region 112 and salicided region 149 of the N+ source/drain region 166. Specifically, the P+ emitter region 112 is coupled to a reference voltage (Vref) line 172, and the N+ source/drain region is coupled to a bit line 174 by way of a portion 175 of a first metal layer and a via 177. The thyristor gate 120 and the gate electrode 162 each respectively forms part of first and second wordlines (WL1 and WL2). The device 100 may be operated using a variety of approaches, with one such approach discussed in further detail below in connection with FIG. 1B.

Various ones of the example embodiments described below in connection with the figures share similar features with each other and with FIG. 1A. In each of these figures, certain discussion of similar features having similarly-numbered (and previously discussed) articles is omitted for brevity.

FIG. 1B shows a semiconductor device 101, similar to the semiconductor device 100 shown in FIG. 1A, according to another example embodiment of the present invention. The semiconductor device 101 includes the thyristor body 110 and the MOSFET 160 electrically coupled in series, with various connections to Vref line 172, Bit line 174 and first and second word lines (WL1 and WL2), as discussed above in connection with FIG. 1A. The thyristor gate 120 and gate electrode 162 are adapted to capacitively couple to the MOSFET 160 and the thyristor body 110, respectively, in response to signals (e.g., at least one edge of a voltage pulse) applied to first (WL1) and second (WL2) word lines 107 and 108.

In response to the signals applied to WL1 107 and WL2 108, and using signals at the bit line 174 and Vref line 172, the circuit 101 is adapted for writing and/or reading data as a function of the conductance state of the thyristor 110. For instance, the state of the thyristor can be used to control the voltage level of storage node 118 (the N+ emitter region) for storing data, which is particularly useful in memory applications, such as embedded memory and others. For more information regarding data storage and manipulation with the semiconductor device 101, and in particular for controlling current in a thyristor-including device with a capacitively coupled thyristor gate, reference may be made to U.S. Pat. No. 6,229,161 (Nemati, et al.), which is fully incorporated herein by reference.

The capacitive coupling of a signal from the thyristor gate 120 to the P-base region 116 for controlling the conductance state of the thyristor 110 does not significantly capacitively couple to the N-base region 114. In one instance, the N-base region 114 is arranged sufficiently away from the thyristor gate 120 so that fringing capacitive coupling therefrom is limited (i.e., does not cause a junction between the N-base region 114 and the P+emitter 112 to become forward biased). In another instance, the N-base region 114 is arranged sufficiently away from the thyristor gate 120 so that the junction between the N-base region 114 and the P-base region 116 is not adjacent to the thyristor gate (i.e., such that junction leakage is negligible).

Generally, as described in the above-mentioned U.S. patent to Nemati, et al., typical operation of the device 101 involves using an array-access controller 102 to provide appropriate control over the bit line 174 and word lines 107 and 108 connecting to the device 101. For example, in standby mode, the word lines 107 and 108 and the bit line 174 are inactive or at their low voltage levels (which can be different for each line). For a write "Zero" operation, the bit line 174 is raised to its high level and WL1 107 becomes active. This charges the level at the storage node 118 to a high voltage level and moves the thyristor 110 out of the strong forward biased region. A pulse is then applied to WL2 108 and is capacitively coupled to the P-base region 116 via thyristor gate 120. The capacitive coupling of the pulse to the P-base region 116 results in an outflow of minority charges therefrom on the falling edge of the pulse and blocks the current pass. The thyristor 110 is sufficiently thin so that the thyristor gate 120 has tight control on the potential of the P-base region 116, and can modulate this potential by the capacitive coupling. The thyristor 110 is switched to the blocking state after this operation.

For a write "One" operation, the voltage level of the bit line 174 is held low. After WL1 107 is raised to its high level, a pulse is applied to WL2 108. The rising edge of this pulse raises the potential of the P-base region 116 by capacitive coupling and makes the NP and PN junctions of the thyristor 110 forward biased. This forward-biased condition in-turn starts the well-known regenerative process in the PNPN thyristor construction and the thyristor 110 transitions to its forward conducting state. After completing such an operation, control over the bit line 174 and word lines 107 and 108 typically changes to effect the standby mode in which a current path through the MOSFET 160 is blocked.

Figure 2:
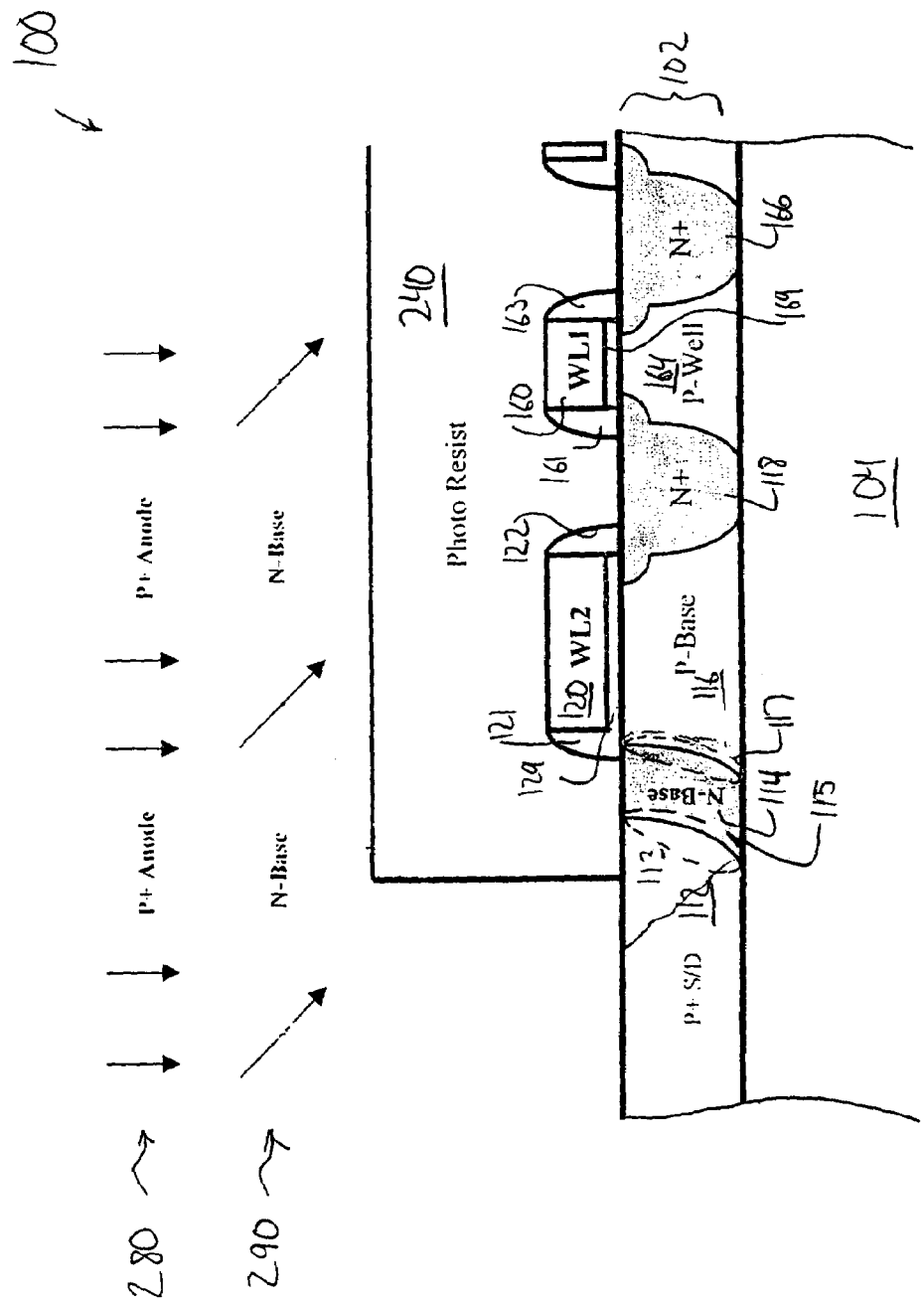
FIG. 2 is a cross-sectional view of the thyristor device of FIG. 1 at an earlier stage of manufacture, according to the present invention.

FIG. 2 shows the semiconductor device 100 shown in FIG. 1A at an earlier stage of manufacture, according to another example embodiment of the present invention. In this instance, a photoresist mask 240 has been formed over portions of the device 100 and used to mask a portion of the silicon layer 102 during implant of the N-base region 114 and subsequent implant of the P+ emitter region 112. As shown by arrows 290, an N-base implant is carried out from left-to-right, using the mask 240 to form N-base region 114 below the mask. After the N-base 114 has been implanted (through a portion of the P+ region 112), a P+ implant is carried out as shown by arrows 280, using the photoresist mask 240 to mask a portion of the silicon layer 102. In this instance, a p-n junction region 115 is shown by dashed lines and includes a portion of the P+ emitter region 112 and the N-base region 114 (as well as an interface therebetween). The upper portion 113 of the emitter region 112 includes at least a portion thereof that extends away from the p-n junction region 115.

The profile of the N-base region 114 is varied at junctions with one or both of the P-base region 116 and the P+ emitter region 112, depending upon the application and various implantation and mask characteristics used. In one implementation, the angle of the implant used to form the N-base region 114 is varied during implantation (e.g., from an angle of about 10 degrees to about 45 degrees to the silicon layer 102). By varying the implant angle, a curved junction between the P-base region 116 and the N-base region 114 (such as shown in FIG. 2) can be achieved. In another implementation, the angle of the N-base implant is held relatively constant, resulting in a junction between the P-base region 116 and the N-base region 114 that is relatively linear. In still another implementation, the placement of the photoresist mask 240 is altered, for example, prior to the N-base 114 implant or between the N-base and P+ emitter 112 implants to achieve various profiles of the regions in the silicon layer 102. Other variations in implant approach, such as those discussed in Wolf et al. (referenced above), can be implemented in connection with these and other example embodiments.

Referring again to FIG. 2, the thyristor gate 120 does not extend over the N-base region 114 (i.e., the thyristor gate therefore underlaps the N-base region 114). The thyristor gate also underlaps a shared interface between the N-base region 114 and the P-base region 116, as well as a p-n junction region 117 at the shared interface. In one or more various alternate implementations, the thyristor gate 120 extends over (i.e., overlaps) one or more of: the p-n junction region 117, the shared interface between the N-base region 114 and the P-base region 116 and the N-base region 114.

Figure 3:
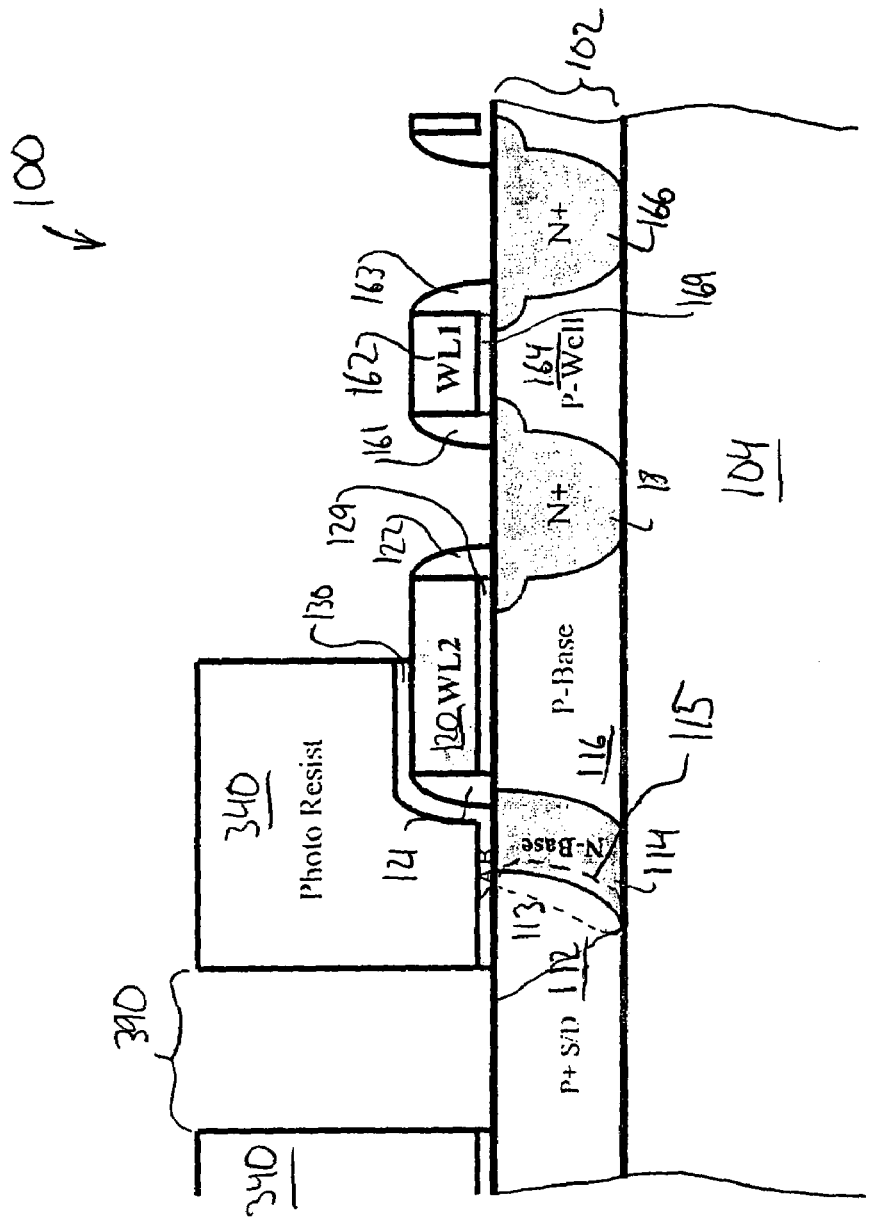
FIG. 3 is a cross-sectional view of the thyristor device of FIG. 1 at an earlier stage of manufacture, according to an example embodiment of the present invention.

In another implementation, the photoresist 240 in FIG. 2 is formed over a salicide block layer, such as shown in FIG. 3 and/or as shown and discussed in connection with U.S. patent application Ser. No. 10/607,588 entitled "Semiconductor Device and Method of Manufacture," filed Jun. 26, 2003, which is incorporated herein by reference. In an alternate implementation, the angled implant includes using a photoresist mask only on one side of the P+ emitter region. Using such a mask approach facilitates the use of a relatively small angle to the implant layer (e.g., relative to that which can be achieved through an opening in a mask layer as shown in FIG. 3).

FIG. 3 shows the semiconductor device 100 shown in FIG. 1A at an earlier stage of manufacture, according to another example embodiment of the present invention. In this instance, a salicide block (SAB) layer 130 has been formed over the silicon layer 102, masked with a photoresist mask 340 (having an opening 390 therein) and etched. Etched portions of the SAB layer 130 expose regions of the device 100 for salicidation (e.g., to subsequently form salicide regions 141, 143, 145, 147 and 149 shown in FIG. 1A).

Figure 4:
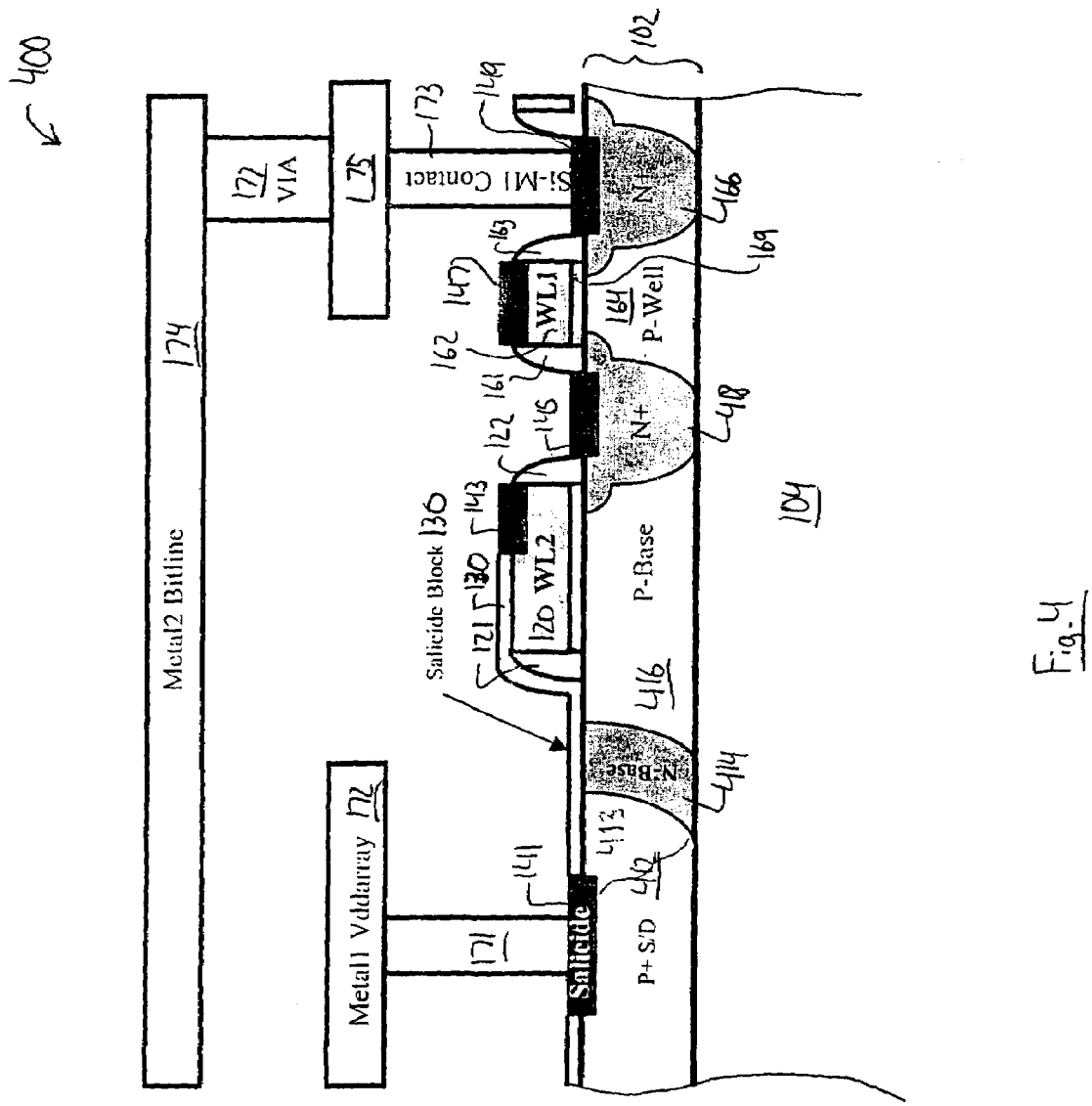
FIG. 4 is a cross-sectional view of yet another thyristor device at a particular stage of manufacture, according to an example embodiment of the present invention.

FIG. 4 shows another semiconductor device 400 having an N-base region 414 angle-implanted through a portion 413 of an adjacent (subsequently-doped) P+ emitter region 412, according to another example embodiment of the present invention. The device 400 is similar, for example, to the device 100 shown in FIG. 1A, with the N-base region 414 in FIG. 4 offset at a relatively greater distance from the thyristor gate 120. Similar to portion 113 in FIG. 1A, portion 413 includes ions of first and second dopant types, the first type being dominant and of the type in the remaining portion of the P+emitter 412 and the second type being of the type in N-base region 414. The resulting width of P-base region 416 is relatively greater than the P-base region 116 in FIG. 1A, with N+ emitter region 418 being relatively similar to N+ emitter region 118 in FIG. 1A.

In one particular implementation, the additional offset of the N-base 414 (relative to N-base 114 in FIG. 1A) is achieved using variation in angle and/or other characteristics of the ion implant thereof, such as variation in a photoresist mask used during the angled ion implant. For instance, using a photoresist mask similar to photoresist 240 shown in FIG. 2, an angled implant having a relatively more vertical angle than that used in the implant approach of FIG. 2 can be used to further offset the N-base region 414 from the thyristor gate 120 as shown. In addition to or in lieu of variation in the angle of the ion implant (relative to that discussed in connection with FIG. 1A), a relatively larger photoresist mask can be used to offset the N-base 414 from the thyristor gate 120. With these approaches, the thyristor gate 120 can be insulated from the N-base 414 for mitigated capacitive coupling between the thyristor gate and the N-base, mitigated junction leakage and/or mitigating the forward-biasing of a junction between the N-base 414 and P+ emitter 412.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; adding a second thyristor gate capacitively coupled to the angle-implanted base region (e.g., for pulsing opposite the thyristor gate capacitively coupled to the adjacent base region); and interchanging P and N regions in the device structures and/or using PMOSFETS or MOSFETS rather than NMOSFETS. In addition, for general information regarding implementations to which the present invention is applicable, and for specific information regarding the construction of circuits described herein, reference may be made to U.S. Pat. No. 6,229,161 (Nemati et al.) and U.S. patent application Ser. No. 10/607, 588 referenced above. Such modifications and changes do not depart from the true spirit and scope of the present invention that is set forth in the following claims.

What is claimed is:

1. A method for manufacturing a thyristor, comprising:
   forming a silicon layer having a first region of a first polarity that is adjacent to a second region of a second polarity;
   forming a gate over a surface of the silicon layer, the gate being positioned above a portion of the first region;
   depositing a first photoresist mask on top of the surface and covering the gate, the second region, and a second portion of the first region that is adjacent to the first portion and away from the second region;
   varying an implant angle during implanting ions of the second polarity to the surface for forming a third region in the silicon layer that is adjacent to the first region and is not underneath the gate; and
   implanting ions of the first polarity to the surface at a substantially vertical direction for forming a fourth region in the silicon layer that is adjacent to the third region.

2. The method of claim 1 further comprising forming at least one sidewall spacer adjacent to the gate, and wherein the first photoresist mask also covers the sidewall spacer.

3. The method of claim 1 further comprising depositing a salicide block to cover at least a portion of the gate and at least a portion of the third and the fourth regions.

4. The method of claim 3 further comprising
   depositing a second photoresist mask on at least a first portion of the salicide block;
   etching a second portion of the salicide block to expose the second portion; and
   forming a salicide region on the exposed second portion.

5. The method of claim 1 wherein the thyristor is a thin capacitively coupled thyristor.

6. The method of claim 1 further comprising forming an access transistor having one of its source/drain in common with the second region.

7. A method for manufacturing a memory cell, comprising:
   forming an access transistor having two source/drain regions in a silicon layer, one of the source/drain regions being adjacent to a first region in the silicon layer, the first region having dopants of a one polarity;
   forming a gate over a surface of the silicon layer, the gate being positioned above a first portion of the first region;
   depositing a first photoresist mask on top of the surface and covering the gate, the access transitor, and a second portion of the first region that is adjacent to the first portion and away from the access transistor;
   varying an implant angle during implanting ions of a second polarity to the surface for forming a second region in the silicon layer that is adjacent to the first region and is not underneath the gate; and
   implanting ions of the first polarity to the surface in a substantially vertical direction for forming a third region in the silicon layer that is adjacent to the second region.

8. The method of claim 7 further comprising forming at least one sidewall spacer adjacent to the gate, and wherein the first photoresist mask also covers the sidewall spacer.

9. The method of claim 7 further comprising depositing a salicide block to cover at least a portion of the gate and at least a portion of the second and the third regions.

10. The method of claim 9 further comprising
    depositing a second photoresist mask on at least a first portion of the salicide block;
    etching a second portion of the salicide block to expose the second portion; and
    forming a salicide region on the exposed second portion.

11. The method of claim 1 wherein the implant angle varies between about 10 to 45 degrees to the silicon layer.

12. The method of claim 7 wherein the implant angle varies between about 10 to 45 degrees to the silicon layer.

* * * * *